(12) United States Patent
Liu et al.

(10) Patent No.: US 11,985,840 B2
(45) Date of Patent: May 14, 2024

(54) DISPLAY SUBSTRATE, MANUFACTURING METHOD THEREOF AND DISPLAY DEVICE

(71) Applicant: BOE Technology Group Co., Ltd., Beijing (CN)

(72) Inventors: Wei Liu, Beijing (CN); Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 76 days.

(21) Appl. No.: 17/352,274

(22) Filed: Jun. 19, 2021

(65) Prior Publication Data

US 2022/0037616 A1 Feb. 3, 2022

(30) Foreign Application Priority Data

Jul. 28, 2020 (CN) .......................... 202010740410.5

(51) Int. Cl.
*H10K 50/824* (2023.01)
*H10K 59/122* (2023.01)
(Continued)

(52) U.S. Cl.
CPC ......... *H10K 50/824* (2023.02); *H10K 59/122* (2023.02); *H10K 71/00* (2023.02);
(Continued)

(58) Field of Classification Search
CPC ........................... H01L 51/5228; H01L 51/56
See application file for complete search history.

(56) References Cited

U.S. PATENT DOCUMENTS

2009/0153046 A1* 6/2009 Hayashi ............. H10K 59/1315
313/505
2014/0312323 A1* 10/2014 Park ....................... H10K 59/123
438/23
(Continued)

FOREIGN PATENT DOCUMENTS

CN 104733500 A 6/2015
CN 105261632 A 1/2016
(Continued)

OTHER PUBLICATIONS

CN2020107404105 first office action.

*Primary Examiner* — Dzung Tran
(74) *Attorney, Agent, or Firm* — IPro, PLLC (57) ABSTRACT

A display substrate including a pixel, and further includes: a substrate; a first-auxiliary-electrode on the substrate; a second-auxiliary-electrode disposed on and electrically connected to the first-auxiliary-electrode, the second auxiliary-electrode comprising a first-conductive-layer on the first-auxiliary-electrode, a second-conductive-layer on the first-conductive-layer, and a barrier layer on the second-conductive-layer, an orthographic projection of the second-conductive-layer on the substrate located within an orthographic projection of the first-conductive-layer on the substrate, and the orthographic projection of the second-conductive-layer located within an orthographic projection of the barrier layer on the substrate; and a first electrode electrically connected to the second-auxiliary-electrode and comprising a first-conductive-portion and a second-conductive-portion connected to each other, the first-conductive-portion disposed on the first-conductive-layer and extending along a surface of the first-conductive-layer, the second-conductive-portion contacting with and extending along a
(Continued)

side surface of the second-conductive-layer, wherein the first electrode is a cathode of the pixel.

18 Claims, 4 Drawing Sheets (51) Int. Cl.
*H10K 71/00* (2023.01)
*H10K 59/12* (2023.01)
*H10K 102/00* (2023.01)
*H10K 102/10* (2023.01)

(52) U.S. Cl.
CPC ..... *H10K 59/1201* (2023.02); *H10K 2102/00* (2023.02); *H10K 2102/103* (2023.02)

(56) References Cited

U.S. PATENT DOCUMENTS

| | | |
|---|---|---|
| 2015/0179719 A1 | 6/2015 | Nam et al. |
| 2016/0013438 A1* | 1/2016 | Im .................. H10K 50/824 257/762 |
| 2016/0149155 A1 | 5/2016 | Kim |
| 2017/0194415 A1* | 7/2017 | Choi .................. H10K 59/122 |
| 2018/0190934 A1 | 7/2018 | Choi et al. |
| 2018/0212007 A1* | 7/2018 | Lee .................. H10K 59/122 |
| 2019/0074338 A1* | 3/2019 | Gu .................. H10K 59/124 |
| 2019/0097161 A1* | 3/2019 | Im .................. H10K 71/231 |

FOREIGN PATENT DOCUMENTS

| | | |
|---|---|---|
| CN | 106206645 A | 12/2016 |
| CN | 108257973 A | 7/2018 |
| CN | 110911461 A | 3/2020 |

* cited by examiner

DISPLAY SUBSTRATE, MANUFACTURING METHOD THEREOF AND DISPLAY DEVICE

CROSS REFERENCES TO RELATED APPLICATIONS

This disclosure claims the priority of a Chinese patent application filed with the Chinese Patent Office, with application number 202010740410.5, entitled "Display Substrate, Manufacturing Method Thereof And Display Device" on Jul. 28, 2020, the entire contents of which are incorporated by reference In this disclosure.

TECHNICAL FIELD

Embodiments of the present disclosure relate to a display substrate, a manufacturing method thereof, and a display device.

BACKGROUND

In the related arts, an organic electroluminescence display device includes a top emitting structure or a bottom emitting structure. The top emitting structure requires a transparent cathode or a semi-transparent cathode. However, for large-size (for example, 14 inches or more) display devices, due to high resistance of the transparent cathode or non-uniformity of relatively low thickness of the semi-transparent cathode, non-uniformity of voltage drops (IR Drop) occurs, and uniformity in display is poor.

SUMMARY

At least one embodiment of the present disclosure provides a display substrate including a pixel, wherein the display substrate further includes:
a substrate;
a first auxiliary electrode, disposed on the substrate;
a second auxiliary electrode, disposed on the first auxiliary electrode and electrically connected to the first auxiliary electrode, the second auxiliary electrode including a first conductive layer, a second conductive layer, and a barrier layer, wherein the first conductive layer is disposed on a side of the first auxiliary electrode away from the substrate, the second conductive layer is disposed on a side of the first conductive layer away from the substrate, and the barrier layer is disposed on a side of the second conductive layer away from the substrate, an orthographic projection of the second conductive layer on the substrate is located within an orthographic projection of the first conductive layer on the substrate, and the orthographic projection of the second conductive layer on the substrate is located within an orthographic projection of the barrier layer on the substrate; and
a first electrode, electrically connected to the second auxiliary electrode, the first electrode including a first conductive portion and a second conductive portion that are connected to each other, the first conductive portion disposed on the first conductive layer and extending along a surface of the first conductive layer away from the substrate, the second conductive portion contacting with a side surface of the second conductive layer and extending along the side surface of the second conductive layer, wherein the first electrode is a cathode of the pixel.

In an embodiment of the present disclosure, the second auxiliary electrode further includes an organic layer disposed between the second conductive layer and the barrier layer, wherein an orthographic projection of the organic layer on the substrate is located within an orthographic projection of the first conductive layer on the substrate, and the orthographic projection of the organic layer on the substrate is located within an orthographic projection of the barrier layer on the substrate.

In an embodiment of the present disclosure, a sum of a thickness of the second conductive layer and a thickness of the organic layer is greater than 1 µm; the thickness of the organic layer ranges from 1 µm to 2 µm; and a distance between an edge of the orthographic projection of the barrier layer on the substrate and an edge of the orthographic projection of the organic layer on the substrate ranges from 0.5 µm to 0.6 µm.

In an embodiment of the present disclosure, the display substrate further includes an insulating layer disposed on a side of the first auxiliary electrode away from the substrate; wherein the second auxiliary electrode is disposed on a side of the insulating layer away from the substrate, and is electrically connected to the first auxiliary electrode through a first via hole passing through the insulating layer.

In an embodiment of the present disclosure, the display substrate further includes a thin film transistor disposed between the substrate and the insulating layer.

In an embodiment of the present disclosure, the display substrate further includes a second electrode disposed on a side of the insulating layer away from the substrate and electrically connected to the thin film transistor through a second via hole passing through the insulating layer, wherein the second electrode is an anode of the pixel.

In an embodiment of the present disclosure, the second electrode includes a fourth conductive layer disposed on a side of the insulating layer away from the substrate; a fifth conductive layer disposed on a side of the fourth conductive layer away from the substrate; and a sixth conductive layer disposed on a side of the fifth conductive layer away from the substrate, wherein an orthographic projection of the fifth conductive layer on the substrate is located within an orthographic projection of the fourth conductive layer on the substrate, and the orthographic projection of the fifth conductive layer on the substrate is located within an orthographic projection of the sixth conductive layer on the substrate.

In an embodiment of the present disclosure, the fourth conductive layer and the first conductive layer are disposed on a same layer, the fifth conductive layer and the second conductive layer are disposed on a same layer, and the barrier layer and the sixth conductive layer are disposed on a same layer.

In an embodiment of the present disclosure, material for the second conductive layer is aluminum neodymium alloy or molybdenum, and a thickness of the second conductive layer ranges from 3000 angstroms to 6000 angstroms; and material for the sixth conductive layer is indium tin oxide, and a thickness of the sixth conductive layer ranges from 120 angstroms to 700 angstroms.

In an embodiment of the present disclosure, the display substrate further includes: a pixel definition layer disposed on the first conductive layer and on the fourth conductive layer, wherein the pixel definition layer includes a first opening and a second opening, the first opening is configured to expose the second auxiliary electrode, and the second opening is configured to expose the second electrode; and an organic light emitting material layer including a first organic light emitting portion, a second organic light emitting portion and a third organic light emitting portion, wherein the first organic light emitting portion is disposed in a region of the first opening adjacent to the pixel definition layer, the second organic light emitting portion is disposed in the second opening and on the second electrode, and the third organic light emitting portion is disposed on a side of the pixel definition layer away from the substrate.

In an embodiment of the present disclosure, the first electrode further includes a third conductive portion disposed on a side of the third organic light emitting portion away from the substrate and electrically connected to the third conductive portion.

In an embodiment of the present disclosure, the first electrode is made of one of indium zinc oxide and magnesium silver alloy.

At least one embodiment of the present disclosure provides a method of manufacturing a display substrate, the display substrate including a pixel, wherein the method includes:

forming a first auxiliary electrode on a substrate;

forming a second auxiliary electrode on the first auxiliary electrode, the second auxiliary electrode including a first conductive layer, a second conductive layer, and a barrier layer, and electrically connected to the first auxiliary electrode, wherein the first conductive layer is located on a side of the first auxiliary electrode away from the substrate, the second conductive layer is located on a side of the first conductive layer away from the substrate, the barrier layer is located on a side of the second conductive layer away from the substrate, an orthographic projection of the second conductive layer on the substrate is located within an orthographic projection of the first conductive layer on the substrate, and the orthographic projection of the second conductive layer is located within an orthographic projection of the barrier on the substrate; and forming a first electrode, wherein the first electrode includes a first conductive portion and a second conductive portion, the first conductive portion is located on the first conductive layer and extends along a surface of the first conductive layer away from the substrate, and the second conductive layer contacts a side surface of the second conductive layer and extends along a side surface of the second conductive layer.

In an embodiment of the present disclosure, forming the second auxiliary electrode further includes: forming an organic layer on the second conductive layer after forming the second conductive layer and before forming the barrier layer, wherein an orthographic projection of the organic layer on the substrate is located within an orthographic projection of the first conductive layer on the substrate, and the orthographic projection of the organic layer on the substrate is located within an orthographic projection of the barrier layer on the substrate; the method further includes forming the barrier layer on the organic layer.

In an embodiment of the present disclosure, before forming the second auxiliary electrode, the method further includes:

forming a thin film transistor on the substrate; and forming an insulating layer on the substrate, the insulating layer covering the first auxiliary electrode and the thin film transistor; wherein, forming the second auxiliary electrode further includes: forming the second auxiliary electrode on a side of the insulating layer away from the substrate, wherein the second auxiliary electrode is electrically connected to the first auxiliary electrode through a first via hole passing through the insulating layer.

In an embodiment of the present disclosure, after forming the insulating layer, the method further includes:

forming a second electrode on a side of the insulating layer away from the substrate, wherein the second electrode is electrically connected to the thin film transistor through a second via hole passing through the insulating layer, and the second electrode is an anode of the pixel; and wherein the second electrode comprises a fourth conductive layer, a fifth conductive layer, and a sixth conductive layer, the fourth conductive layer is located on a side of the insulating layer away from the substrate; the fifth conductive layer is located on a side of the fourth conductive layer away from the substrate, the sixth conductive layer is located on a side of the fifth conductive layer away from the substrate, an orthographic projection of the fifth conductive layer on the substrate is located within an orthographic projection of the fourth conductive layer on the substrate, and the orthographic projection of the fifth conductive layer on the substrate is located within an orthographic projection of the sixth conductive layer on the substrate.

In an embodiment of the present disclosure, the method includes at least one of following:

forming the fourth conductive layer and the first conductive layer in a single patterning process;

forming the fifth conductive layer and the second conductive layer in a single patterning process; and forming the barrier layer and the sixth conductive layer in a single patterning process.

In an embodiment of the present disclosure, the first auxiliary electrode and a metal layer of the thin film transistor are formed in a single patterning process.

At least one embodiment of the present disclosure further provides a display device, which comprises the display substrate as described above.

It should be understood that the above general description and the following detailed description are only exemplary and explanatory, and cannot be construed as a limit to the present disclosure.

BRIEF DESCRIPTION OF THE DRAWINGS

The drawings herein are incorporated into the specification and constitute a part of the specification, illustrate embodiments consistent with the disclosure, and are used along with the specification to explain the principle of the disclosure.

DETAILED DESCRIPTION OF THE EMBODIMENTS

The exemplary embodiments will be described in detail here, and examples thereof are illustrated in the accompanying drawings. When the following description refers to the drawings, unless otherwise indicated, the same reference signs in different drawings indicate the same or similar elements. The implementations described in the following exemplary embodiments do not represent all implementations consistent with the present disclosure. On the contrary, they are merely examples of devices and methods consistent with some aspects of the present disclosure as set forth in the appended claims.

In the related art, if a transparent cathode (such as indium zinc oxide (IZO)) is used in an organic electroluminescence display device with a top-emitting structure, and a size of the display device is large, the cathode needs to be made very thick in order to meet the display effect of the display device. Otherwise the cathode resistance is not small enough, IR Drop problem will occur, which results in poor uniformity in display. However, for large-size display devices, it is a great challenge for the manufacturing processes to make a relatively thick cathode, and the yield is low. Therefore, an auxiliary cathode is required in the display device.

Embodiments of the present disclosure provide a display substrate, a manufacturing method thereof, and a display device, which can increase contact area between the cathode and the auxiliary cathode and reduce the contact resistance between the cathode and the auxiliary cathode.

Figure 1:
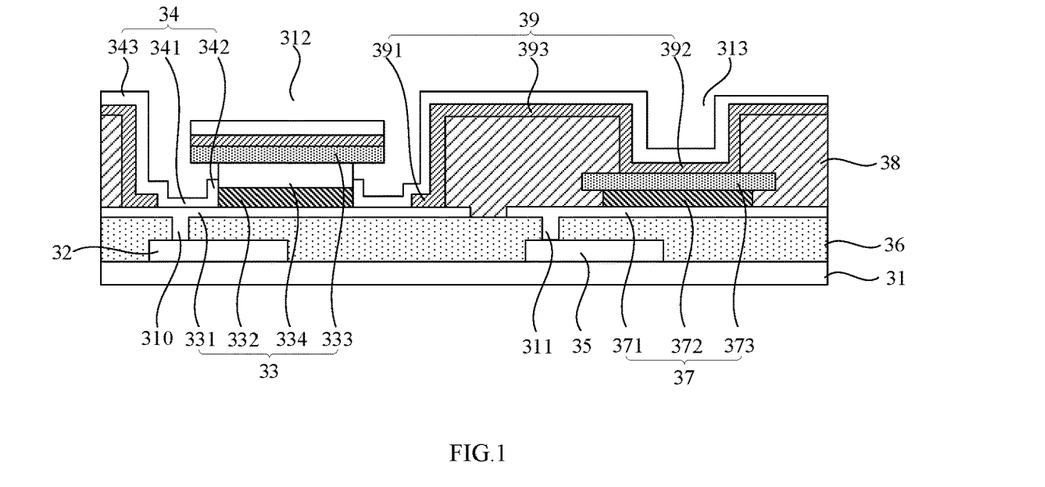
FIG. 1 illustrates a schematic structural diagram of a display substrate according to an embodiment of the present disclosure.

At least one embodiment of the present disclosure provides a display substrate. The display substrate includes at least one pixel. As illustrated in FIG. 1, the display substrate further includes: a substrate 31, a first auxiliary electrode 32, a second auxiliary electrode 33 and a first electrode 34.

As illustrated in FIG. 1, the first auxiliary electrode 32 is disposed on the substrate 31. The second auxiliary electrode 33 is disposed on the first auxiliary electrode 32 and is electrically connected to the first auxiliary electrode 32. The second auxiliary electrode 33 includes a first conductive layer 331, a second conductive layer 332, and a barrier layer 333. The first conductive layer 331 is disposed on a side of the first auxiliary electrode 32 away from the substrate 31, and the second conductive layer 332 is disposed on a side of the first conductive layer 331 away from the substrate, the barrier layer 333 is disposed on a side of the second conductive layer 332 away from the substrate 31, an orthographic projection of the second conductive layer 332 on the substrate 31 is located within an orthographic projection of the first conductive layer 331 on the substrate 31, and the orthographic projection of the second conductive layer 332 on the substrate 31 is located within an orthographic projection of the barrier layer 333 on the substrate 31.

As illustrated in FIG. 1, the first electrode 34 is electrically connected to the second auxiliary electrode 33. The first electrode 34 includes a first conductive portion 341 and a second conductive portion 342. The second conductive portion 342 is electrically connected to the first conductive portion 341. The conductive portion 341 is disposed on the first conductive layer 331 and extends along a surface of the first conductive layer 331 away from the substrate 31. The second conductive portion 342 contacts with the second conductive layer 332 and extends along a side surface of the second conductive layer 332. The first electrode 34 is a cathode of the pixel.

In the embodiment of the present disclosure, since the second auxiliary electrode 33 is electrically connected to the first auxiliary electrode 32, the first electrode 34 is electrically connected to the second auxiliary electrode 33, and the second auxiliary electrode 33 includes a first conductive layer 331 and a second conductive layer 332, the first conductive layer 331 is disposed on a side of the first auxiliary electrode 32 away from the substrate 31, and the second conductive layer 332 is disposed on a side of the first conductive layer 331 away from the substrate 31, the first electrode 34 includes a first conductive portion 341 and a second conductive portion 342 which is electrically connected to the first conductive portion 341, the first conductive portion 341 is disposed on the first conductive layer 331 and extends along a surface of the first conductive layer 331 away from the substrate 31. That is, the first electrode 34 and the second auxiliary electrode 33 contact with each other in a direction parallel to the substrate 31, and the second conductive portion 342 contacts with a side surface of the second conductive layer 332 and extends along the side surface of the second conductive layer 332. That is, the first electrode 34 and the second auxiliary electrode 33 also contacts with each other in a direction along the side surface of the second conductive layer 332. In this way, contact area between the first electrode 34 and the second auxiliary electrode 33 can be increased, thereby increasing contract area between the first electrode 34 and the first auxiliary electrode 32 and reducing contact resistance between the first electrode 34 and the first auxiliary electrode 32.

The display substrate according to the embodiment of the present disclosure is briefly introduced above, and the display substrate according to the embodiment of the present disclosure will be described in detail hereinafter.

An embodiment of the present disclosure provides a display substrate. The display substrate includes at least one pixel, wherein at least part of the at least one pixel may be arranged in an array, but the present disclosure is not limited thereto. Each pixel of the at least one pixel may be an Organic Light-Emitting Diode (OLED) pixel.

In an embodiment of the present disclosure, each pixel may include at least two sub-pixels, and each sub-pixel may include a first electrode 34, an organic light emitting material layer 39, and a second electrode 37. The first electrode 34 may be a cathode, and the second electrode 37 may be an anode, and the organic light emitting material layer 39 is disposed between the first electrode 34 and the second electrode 37. The cathodes of some sub-pixels may form a plate electrode.

In the embodiments of the present disclosure, colors of light emitted from the sub-pixels of the same pixel may be same or different. In an embodiment of the present disclosure, each pixel may include three sub-pixels that emit white light, and a color filter may be disposed on a side of each sub-pixel away from the substrate 31, for example, a red color filter may be disposed on a side of one sub-pixel away from the substrate 31, a green color filter may be disposed on a side of one sub-pixel away from the substrate 31, and a blue color filter may be disposed on a side of one sub-pixel away from the substrate 31. In another embodiment of the present disclosure, each pixel may include three sub-pixels which emit different color lights, for example, one sub-pixel emits red light, one sub-pixel emits blue light, and one sub-pixel emits green light.

In an embodiment of the present disclosure, as illustrated in FIG. 1, the display substrate further includes: a substrate 31, a first auxiliary electrode 32, a second auxiliary electrode 33, a first electrode 34, a thin film transistor 35, an insulating layer 36, and a second electrode 37, a pixel definition layer 38, and an organic light emitting material layer 39.

As illustrated in FIG. 1, the first auxiliary electrode 32 is disposed on the substrate 31. In an embodiment of the present disclosure, the first auxiliary electrode 32 and any metal layer in the thin film transistor may be formed in a single process, or the first auxiliary electrode 32 and a light-shielding layer disposed between the thin film transistor 35 and the substrate 31 may be disposed in a same layer. The first auxiliary electrode 32 may be a patterned metal layer. Area of the first auxiliary electrode 32 may be relatively large, and/or a thickness of the first auxiliary electrode 32 may be relatively great, so that a resistance of the cathode of the pixel can be greatly reduced.

As illustrated in FIG. 1, the thin film transistor 35 is disposed between the substrate 31 and the insulating layer 36. The think film transistor 35 as illustrated in in FIG. 1 is a driving transistor. Other transistors and electrical elements of a pixel circuit of the pixel, such as capacitors, may also be disposed between the substrate 31 and the insulating layer 36.

In an embodiment of the present disclosure, as illustrated in FIG. 1, the insulating layer 36 is disposed on a side of the first auxiliary electrode 32 away from the substrate 31. The insulating layer 36 may be a planarization layer, and material for the planarization layer may include any one or any combination of polyamide, polyurethane, phenol resin, and polysiloxane, but the present disclosure is not limited thereto.

In an embodiment of the present disclosure, as illustrated in FIG. 1, the second auxiliary electrode 33 is disposed on a side of the insulating layer 36 away from the substrate 31, and is electrically connected to the first auxiliary electrode 32 through a first via hole 310 passing through the insulating layer 36. In this way, the second auxiliary electrode 33 and the first auxiliary electrode 32 are electrically connected.

In an embodiment of the present disclosure, as illustrated in FIG. 1, the second auxiliary electrode 33 includes a first conductive layer 331, a second conductive layer 332, an organic layer 334 and a barrier layer 333.

In an embodiment of the present disclosure, as illustrated in FIG. 1, the first conductive layer 331 is disposed on a side of the insulating layer 36 away from the substrate 31. Material for the first conductive layer 331 may be indium tin oxide (ITO), but is not limited thereto.

In an embodiment of the present disclosure, as illustrated in FIG. 1, the second conductive layer 332 is disposed on a side of the first conductive layer 331 away from the substrate 31. An orthographic projection of the second conductive layer 332 on the substrate 31 is located within an orthographic projection of the first conductive layer 331 on the substrate 31, and the orthographic projection of the second conductive layer 332 on the substrate 31 is located within an orthographic projection of the barrier layer 333 on the substrate 31.

In an embodiment of the present disclosure, material for the second conductive layer 332 is an aluminum (Al) neodymium (Nd) alloy, and a thickness of the second conductive layer 332 ranges from 3000 angstroms to 6000 angstroms, for example, the thickness of the second conductive layer 332 may be 3000 angstroms, 4000 angstroms, 5000 angstroms, or 6000 angstroms. In an embodiment of the present disclosure, a thickness of the second conductive layer 332 is 6000 angstroms. In another embodiment of the present disclosure, material for the second conductive layer 332 may be molybdenum (Mo), instead.

In an embodiment of the present disclosure, as illustrated in FIG. 1, the organic layer 334 is disposed between the second conductive layer 332 and the barrier layer 333, and an orthographic projection of the organic layer 334 on the substrate 31 is located within an orthographic projection of the first conductive layer 331 on the substrate, and the orthographic projection of the organic layer 334 on the substrate 31 is located within an orthographic projection of the barrier layer 333 on the substrate 31.

In an embodiment of the present disclosure, a sum of the thickness of the second conductive layer 332 and a thickness of the organic layer 334 is greater than 1 micrometer. In this way, the second conductive layer 332 and the organic layer 334 can be made high enough so that after the organic light emitting material layer 39 is evaporated, there is a sufficient height difference between the second conductive layer 332 and the pixel definition layer 38 to deposit the first electrode 34.

In an embodiment of the present disclosure, the thickness of the organic layer 334 ranges from 1 micrometer to 2 micrometers. For example, the thickness of the organic layer 334 is 1 μm, 1.5 μm, or 2 μm. In an embodiment of the present disclosure, the thickness of the organic layer 334 is 1.5 μm.

In an embodiment of the present disclosure, material for the organic layer 334 may be same as material for the planarization layer, or may be same as material for the pixel definition layer 38. For example, material for the organic layer 334 may include any one or any combination of polyamide, polyurethane, phenol resin, polysiloxane, polyimide, polymethyl methacrylate, fluorinated polyimide, fluorinated polymethyl methacrylate, but the present disclosure is not limited thereto.

In an embodiment of the present disclosure, as illustrated in FIG. 1, the barrier layer 333 is disposed on a side of the organic layer 334 away from the substrate 31 and is configured to block the organic light emitting material layer 39. An orthographic projection of the organic layer 334 on the substrate is located within an orthographic projection of the barrier layer 333 on the substrate, and a distance between an edge of the orthographic projection of the barrier layer 333 on the substrate 31 and an edge of the orthographic projection of the organic layer 334 on the substrate 31 ranges from 0.5 μm to 0.6 μm. For example, the distance between the edge of the orthographic projection of the barrier layer 333 on the substrate 31 and the edge of the orthographic projection of the organic layer 334 on the substrate 31 may be 0.5 μm, 0.55 μm, or 0.6 μm. In an embodiment of the present disclosure, the distance between the edge of the orthographic projection of the barrier layer 333 on the substrate 31 and the edge of the orthographic projection of the organic layer 334 on the substrate 31 is 0.5 μm.

In an embodiment of the present disclosure, material for the barrier layer 333 may be indium tin oxide (ITO), but the present disclosure is not limited thereto.

In an embodiment of the present disclosure, as illustrated in FIG. 1, the edge of the orthographic projection of the second conductive layer 332 on the substrate 31 coincides with the edge of the orthographic projection of the organic layer 334 on the substrate 31, but the present disclosure is not limited to this.

In an embodiment of the present disclosure, as illustrated in FIG. 1, the second electrode 37 is disposed on a side of the insulating layer 36 away from the substrate 31, and is electrically connected to the thin film transistor 35 through a second via hole 311 passing through the insulating layer 36, and the second electrode 37 is an anode of the pixel.

In an embodiment of the present disclosure, as illustrated in FIG. 1, the second electrode 37 includes a fourth conductive layer 371, a fifth conductive layer 372 and a sixth conductive layer 373. The fourth conductive layer 371 is disposed on a side of the insulating layer 36 away from the substrate 31, the fifth conductive layer 372 is disposed on a side of the fourth conductive layer 371 away from the substrate 31, and the sixth conductive layer 373 is disposed on a side of the fifth conductive layer 372 away from the substrate 31, an orthographic projection of the fifth conductive layer 372 on the substrate 31 is located within an orthographic projection of the fourth conductive layer 371 on the substrate 31, and the orthographic projection of the fifth conductive layer 372 on the substrate 31 is located within an orthographic projection of the sixth conductive layer 373 on the substrate 31.

In an embodiment of the present disclosure, as illustrated in FIG. 1, the fourth conductive layer 371 and the first conductive layer 331 are disposed in a same layer. In the present disclosure, the term "disposed in a same layer" refers to being formed from the same material and in a single patterning process. A patterning process includes coating photoresist on a film to be patterned, exposing and developing the photoresist through a mask, etching the film to be patterned with remained photoresist as a mask, and then removing the remained photoresist so as to form a desired pattern.

In an embodiment of the present disclosure, as illustrated in FIG. 1, the fifth conductive layer 372 and the second conductive layer 332 are disposed in a same layer. Material for the fifth conductive layer 372 may be a metal material with high reflectivity and large etching critical dimension bias (CD Bias), for example, an aluminum neodymium alloy.

In an embodiment of the present disclosure, both the sixth conductive layer 373 and the barrier layer 333 are made of indium tin oxide.

In an embodiment of the present disclosure, a thickness of the sixth conductive layer 373 may be determined according to light emitting requirements. The thickness of the sixth conductive layer 373 ranges from 120 Å to 700 Å. For example, the thickness of the sixth conductive layer 373 may be 120 Å, 200 Å, 300 Å, 400 Å, 500 Å, and 600 Å, or 700 Å, and the present disclosure are not limited thereto.

In an embodiment of the present disclosure, as illustrated in FIG. 1, a pixel definition layer 38 is disposed on the first conductive layer 331 and the fourth conductive layer 371, and the pixel definition layer 38 includes a first opening 312 and a second opening 313, the first opening 312 is configured to expose the second auxiliary electrode 33, and the second opening 313 is configured to expose the second electrode 37 and to define light emitting area of the pixel. The pixel definition layer 38 further completely covers an edge of the second electrode 37 to prevent the organic light emitting material layer 39, the first electrode 34 and the second electrode 37 from contacting, which causes a short circuit.

In an embodiment of the present disclosure, as illustrated in FIG. 1, the organic light emitting material layer 39 includes a first organic light emitting portion 391, a second organic light emitting portion 392, and a third organic light emitting portion 393, and the first organic light emitting portion 391 is disposed in a region of the first opening 312 adjacent to the pixel definition layer 38, the second organic light emitting portion 392 is disposed in the second opening 313 and on the second electrode 37, and the third organic light emitting portion 393 is disposed on a side of the pixel definition layer 38 away from the substrate 31. The second organic light emitting portion 392, the first electrode 34, and the second electrode 37 may constitute a sub-pixel.

In an embodiment of the present disclosure, as illustrated in FIG. 1, the first electrode 34 is electrically connected to the second auxiliary electrode 33. The first electrode 34 includes a first conductive portion 341, a second conductive portion 342, and a third conductive portion 343, the second conductive portion 342 is electrically connected to the first conductive portion 341, and the third conductive portion 343 is electrically connected to the first conductive portion 341. The first conductive portion 341 is disposed on the first conductive layer 331 and extends along a surface of the first conductive layer 331 away from the substrate 31. The second conductive portion 342 contacts with the second conductive layer 332 and extends along a side surface of the second conductive layer 332, and the third conductive portion 343 is disposed on a side of the third organic light emitting portion 393 away from the substrate 31. In an embodiment of the present disclosure, the first electrode 34 is a cathode of the pixel.

In an embodiment of the present disclosure, material for the first electrode 34 is a transparent conductive material, for example, indium zinc oxide (IZO). In an embodiment of the present disclosure, the material for the first electrode 34 may further be a magnesium-silver alloy.

In an embodiment of the present disclosure, the first electrode 34 is electrically connected to the first auxiliary electrode 32 through the second auxiliary electrode 33, because the first conductive portion 341 of the first electrode 34 is disposed on the first conductive layer 331 of the second auxiliary electrode 33 and extends along the surface of the first conductive layer 331 away from the surface of the substrate 31, that is, the first electrode 34 contacts with the second auxiliary electrode 33 in a direction parallel to the substrate 31, and as the second conductive portion 342 of the first electrode 34 contacts with the side surface of the second conductive layer 332 of the second auxiliary electrode 33 and extends along the side surface of the second conductive layer 332 of the second auxiliary electrode 33, that is, the first electrode 34 also contacts with the second auxiliary electrode 33 along a direction of the side surface of the second conductive layer of 332. In this way, contact area between the first electrode 34 and the second auxiliary electrode 33 can be increased, thereby increasing contact area between the first electrode 34 and the first auxiliary electrode 32, and reducing contact resistance between the first electrode 34 and the first auxiliary electrode 32.

In an embodiment of the present disclosure, the side surface of the second conductive layer 332 is perpendicular to the surface of the first conductive layer 331 away from the substrate 31. It is assumed that the direction parallel to the surface of the first conductive layer 331 away from the substrate 31 is a lateral direction, and the direction parallel to the side surface of the second conductive layer 332 is a longitudinal direction. Since the first electrode 34 is the cathode, the second auxiliary electrode 33 and the first auxiliary electrode 32 together form an auxiliary cathode. Therefore, the cathode and the auxiliary cathode not only have a contact surface in the lateral direction, but also a contact surface in the longitudinal direction, which increases the contact area between the cathode and the auxiliary cathode and may reduce the contact resistance between the cathode and the auxiliary cathode.

Figure 2:
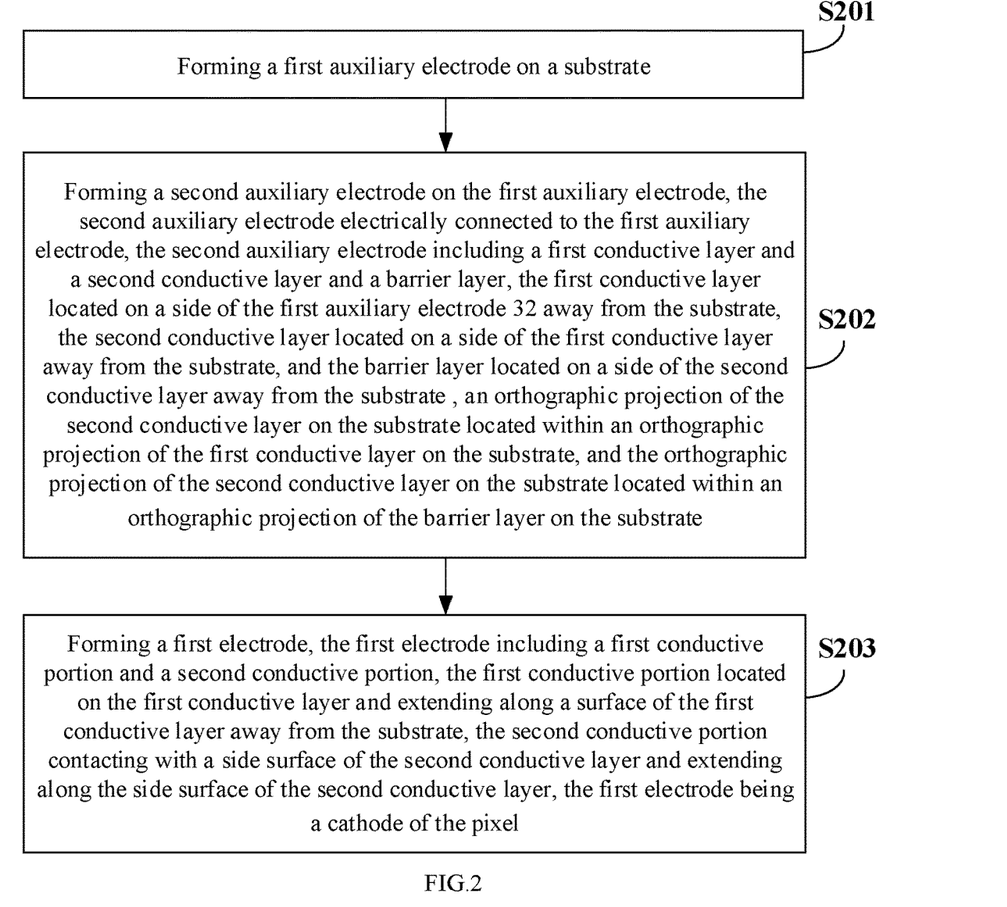
FIG. 2 illustrates a flowchart of a method of manufacturing a display substrate according to an embodiment of the present disclosure.

At least one embodiment of the present disclosure further provides a method of manufacturing a display substrate, which is applicable to manufacture the above-mentioned display substrate. The display substrate includes at least one pixel. As illustrated in FIG. 2, the method of manufacturing the display substrate includes the following steps S201 to S203:

In step S201, a first auxiliary electrode 32 is formed on a substrate 31.

In step S202, a second auxiliary electrode 33 is formed on the first auxiliary electrode 32. The second auxiliary electrode 33 is electrically connected to the first auxiliary electrode 32. The second auxiliary electrode 33 includes a first conductive layer 331 and a second conductive layer 332 and a barrier layer, the first conductive layer 331 is located on a side of the first auxiliary electrode 32 away from the substrate 31, the second conductive layer 332 is located on a side of the first conductive layer 331 away from the substrate 31, and the barrier layer is located on a side of the second conductive layer 332 away from the substrate 31, an orthographic projection of the second conductive layer 332 on the substrate 31 is located within an orthographic projection of the first conductive layer 331 on the substrate 31, and the orthographic projection of the second conductive layer 332 on the substrate 31 is located within an orthographic projection of the barrier layer on the substrate 31.

In step S203, a first electrode 34 is formed. The first electrode 34 includes a first conductive portion 341 and a second conductive portion 342. The first conductive portion 341 is located on the first conductive layer 331 and extends along a surface of the first conductive layer 331 away from the substrate 31. The second conductive portion 342 contacts with a side surface of the second conductive layer 332 and extends along the side surface of the second conductive layer 332. The first electrode 34 is a cathode of the pixel.

In an embodiment of the present disclosure, since the second auxiliary electrode 33 is electrically connected to the first auxiliary electrode 32, the first electrode 34 is electrically connected to the second auxiliary electrode 33, and the second auxiliary electrode 33 includes the first conductive layer 331 and the second conductive layer 332, the first conductive layer 332 is located on the side of the first auxiliary electrode 32 away from the substrate 31, and the second conductive layer 332 is located on the side of the first conductive layer 331 away from the substrate 31, the first electrode 34 includes a first conductive portion 341 and a second conductive portion 342, and the second conductive portion 342 is electrically connected to the first conductive portion 341, the first conductive portion 341 is located on the first conductive layer 331 and extends along the surface of the first conductive layer 331 away from the substrate 31, that is, the first electrode 34 contacts with the second auxiliary electrode 33 in a direction parallel to the substrate 31, and the second conductive portion 342 contacts with the side surface of the second conductive layer 332 and extends along the side surface of the second conductive layer 332, that is, the first electrode 34 also contacts with the second auxiliary electrode 33 in a direction along the side surface of the second conductive layer 332. In this way, the contact area between the first electrode 34 and the second auxiliary electrode 33 can be increased, thereby increasing the contact area between the first electrode 34 and the first auxiliary electrode 32, and reducing the contact resistance between the first electrode 34 and the first auxiliary electrode 32. Moreover, manufacturing process thereof is relatively simple, which is conducive to improve the yield, and conventional processes may be used to manufacture the display substrate without requiring special material and new equipment.

The method of manufacturing the display substrate according to the embodiments of the present disclosure is briefly introduced above, and the method of manufacturing the display substrate according to the embodiments of the present disclosure will be described in detail hereinafter.

Figure 3:
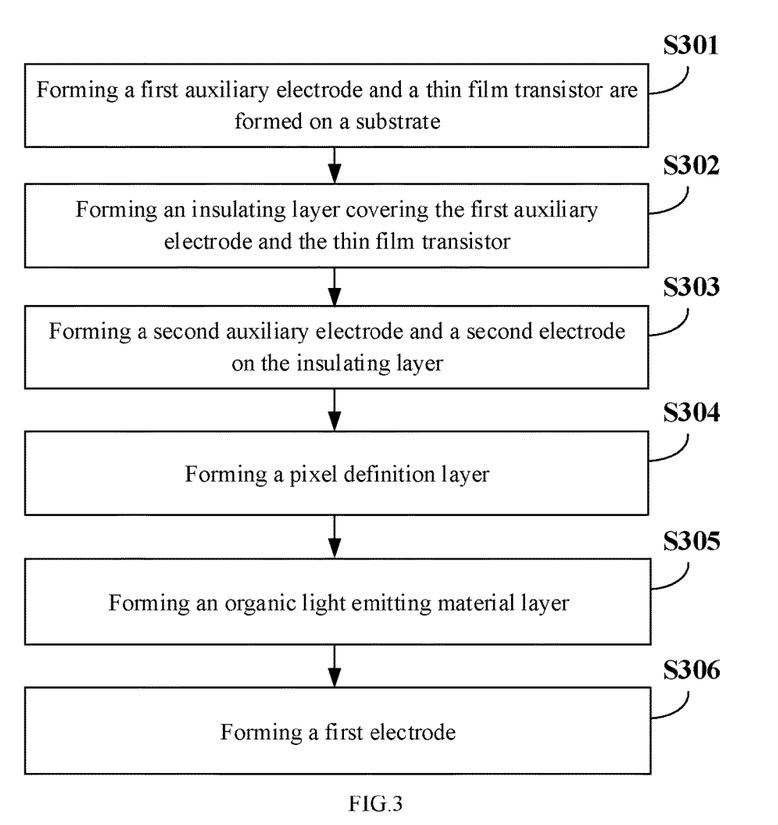
FIG. 3 illustrates a flowchart of a method of manufacturing a display substrate according to another embodiment of the present disclosure.

Embodiment of the present disclosure further proposes a method of manufacturing a display substrate, which is suitable to manufacture the display substrate as described above. As illustrated in FIG. 3, the method includes the following steps S301 to S306:

In step S301, a first auxiliary electrode 32 and a thin film transistor 35 are formed on a substrate 31.

Figure 4:
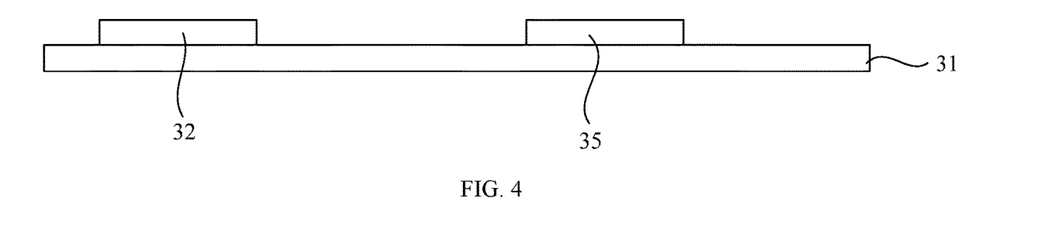
FIGS. 4 to 11 illustrate schematic diagrams of intermediate structures obtained by the process of manufacturing a display substrate according to an embodiment of the present disclosure.

In this step, after forming the first auxiliary electrode 32 and the thin film transistor 35 on the substrate 31, an intermediate structure as illustrated in FIG. 4 is obtained.

It should be noted that the first auxiliary electrode 32 may be formed before the thin film transistor 35, or after the thin film transistor 35, the thin film transistor 35 may include at least two metal layers, the first auxiliary electrode 32 may further be formed in the same process as any one of the metal layers of the thin film transistor 35.

In step S302, an insulating layer 36 covering the first auxiliary electrode 32 and the thin film transistor 35 is formed.

Figure 5:
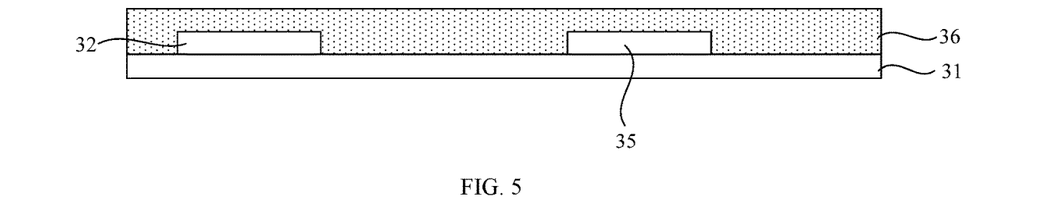

In this step, after forming the insulating layer 36, an intermediate structure as illustrated in FIG. 5 is obtained.

In step S303, a second auxiliary electrode 33 and a second electrode 37 are formed on the insulating layer.

Figure 6:
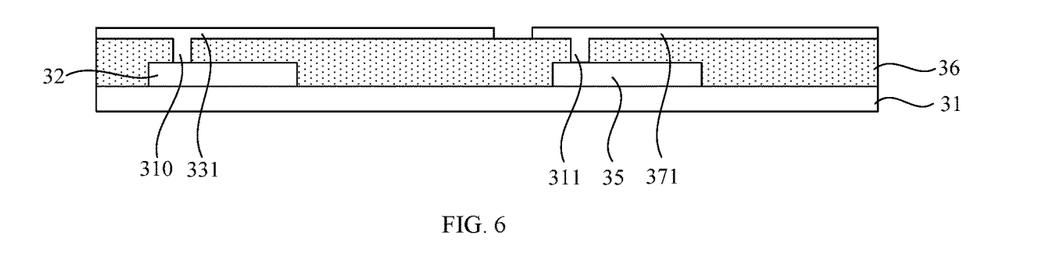

Step S303 may include the following steps:

First, a first conductive layer 331 and a fourth conductive layer 371 are formed on the insulating layer 36. After forming the first conductive layer 331 and the fourth conductive layer 371 on the insulating layer 36, an intermediate structure as illustrated in FIG. 6 is obtained. For example, a first via hole and a second via hole may be formed in the insulating layer 36 first, the first via hole is located on the first auxiliary electrode 32 and the second via hole is located on the thin film transistor 35. Then, a first metal oxide layer is obtained by depositing indium tin oxide on the insulating layer 36, and the first metal oxide layer is patterned to form a first via 310, a second via 311, a first conductive layer 331, and a fourth conductive layer 371. That is, the fourth conductive layer 371 and the first conductive layer 331 are formed by a single process, and the fourth conductive layer 371 and the first conductive layer 331 are made of the same material.

Figure 7:
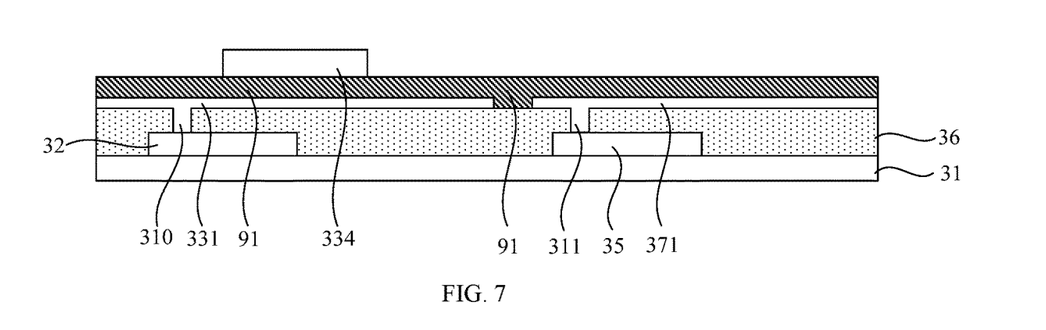

Next, a first metal layer 91 is formed on the first conductive layer 331 and the fourth conductive layer 371, and an organic layer 334 is formed on the first metal layer 91. After the organic layer 334 is formed, an intermediate structure as illustrated in FIG. 7 is obtained. Material for the first metal layer 91 is the same as the material for the second conductive layer 332 and the material for the fifth conductive layer 372.

Figure 8:
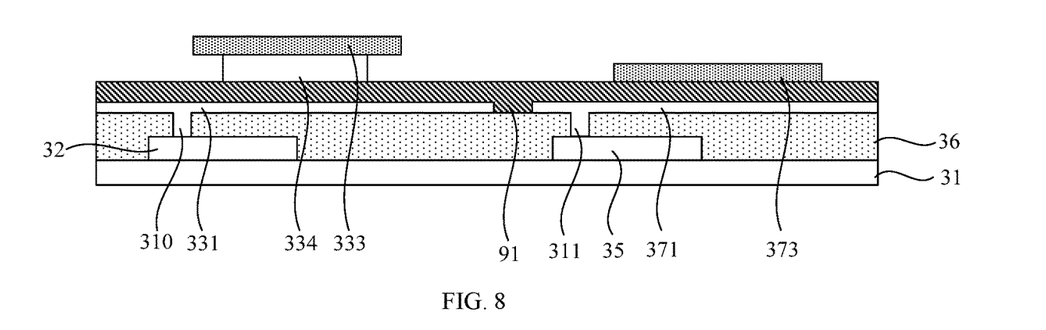

Next, a barrier layer 333 and a sixth conductive layer 373 are formed. After forming the barrier layer 333 and the sixth conductive layer 373, an intermediate structure as illustrated in FIG. 8 is obtained. For example, a second metal oxide layer may be obtained by depositing indium tin oxide on the first metal layer 91 and the organic layer 334, and then the second metal oxide layer is patterned to obtain the barrier layer 333 and the sixth conductive layer 373. That is, the barrier layer 333 and the sixth conductive layer 373 are formed by a single process, and material for the barrier layer 333 is the same as material for the sixth conductive layer 373.

Figure 9:
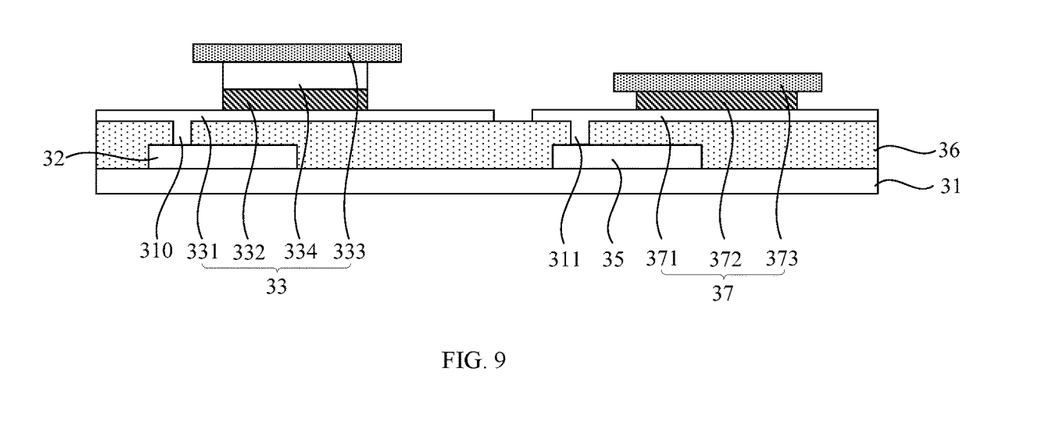

Then, the first metal layer 91 is etched to form a second conductive layer 332 and a fifth conductive layer 372. After forming the second conductive layer 332 and the fifth conductive layer 372, an intermediate structure as illustrated in FIG. 9 is obtained. After forming the second conductive layer 332 and the fifth conductive layer 372, the second auxiliary electrode 33 and the second electrode 37 are obtained. The second conductive layer 332 and the fifth conductive layer 372 are formed by a single process, and material for the fifth conductive layer 372 is same as material for the second conductive layer 332.

Figure 10:
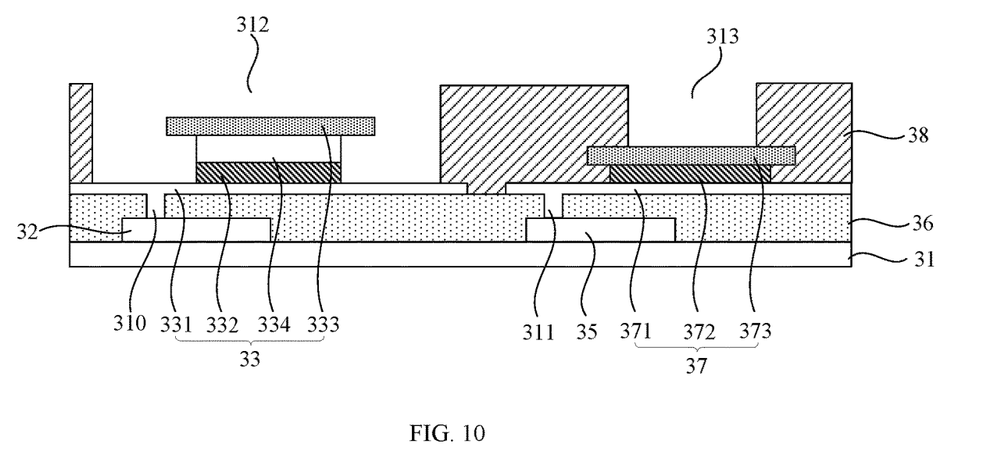

In step S304, a pixel definition layer 38 is formed. After forming the pixel definition layer 38, an intermediate structure as illustrated in FIG. 10 is obtained. The pixel definition layer 38 is provided with a first opening 312 and a second opening 313. The first opening 312 is configured to expose the second auxiliary electrode 33, and the second opening 313 is configured to expose the second electrode 37 and to define light emitting area of the pixel.

Figure 11:
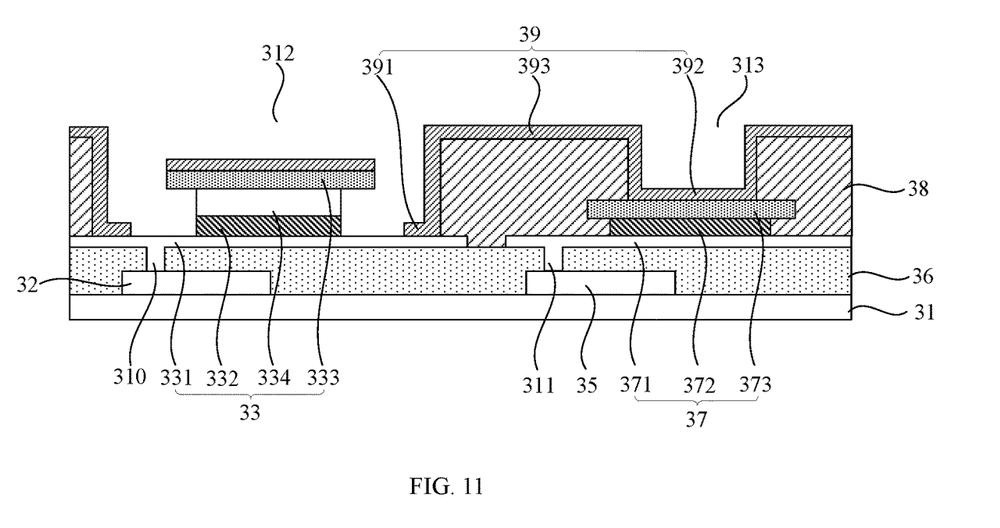

In step S305, an organic light emitting material layer 39 is formed. After forming the organic light emitting material layer 39 is formed, an intermediate structure as illustrated in FIG. 11 is obtained.

In step S306, a first electrode 34 is formed. After forming the first electrode 34, the structure of the display substrate as illustrated in FIG. 1 is obtained.

In the embodiments of the present disclosure, difficulty of the manufacturing process for the display substrate is not high, and the process complexity is equivalent to the process complexity in the related arts, and special materials and new equipment are not required, and conventional processes of manufacturing the display substrate may be adopted to implement operations of the method according to the present disclosure.

At least one embodiment of the present disclosure further provides a display device, including a display module, and further including the display substrate as described in any of the above embodiments.

It should be noted that the display device according to the embodiments of the present disclosure may be any product or component with display function, such as electronic paper, a mobile phone, a tablet computer, a television, a laptop computer, a digital photo frame, a navigator, and etc.

The processes used in the above manufacturing method may include, for example, film forming processes such as deposition and sputtering, and patterning processes such as etching.

It should be noted that in the drawings, sizes of layers and regions may be exaggerated for clarity of illustration. It will be further noted that in a case that an element or layer is referred to as being "on" other element or layer, it can be directly on the other element or an intervening layer may be present. In addition, it will be noted that in a case that an element or layer is referred to as being "under" other element or layer, it can be directly under the other element, or there may be one or more than one intervening layer or element. In addition, it can further be noted that in a case that a layer or element is referred to as being "between" two layers or two elements, it can be the only layer between the two layers or two elements, or more than one intervening layers or components may further be present. Similar reference signs indicate similar elements throughout the specification.

In the present disclosure, the terms "first" and "second" are only used for descriptive purposes, and cannot be construed as indicating or implying relative importance. The term "plurality" refers to two or more, unless specifically defined otherwise.

One of ordinary skill in the art will easily conceive of other embodiments of the present disclosure after considering the specification and practicing the disclosure disclosed herein. The present disclosure is intended to cover any variations, applications, or modifications of the present disclosure. These variations, applications, or modifications follow the general principles of the present disclosure and include common knowledge or conventional technical means in the art that are not disclosed in the present disclosure. The description and the embodiments are to be regarded as exemplary only, and the true scope and spirit of the present disclosure are defined by the appended claims.

The invention claimed is:

1. A display substrate comprising a pixel, wherein the display substrate further comprises:
    a substrate;
    a first auxiliary electrode, disposed on the substrate;
    a second auxiliary electrode, disposed on the first auxiliary electrode and electrically connected to the first auxiliary electrode, the second auxiliary electrode comprising a first conductive layer, a second conductive layer, and a barrier layer, wherein the first conductive layer is disposed on a side of the first auxiliary electrode away from the substrate, the second conductive layer is disposed on a side of the first conductive layer away from the substrate, and the barrier layer is disposed on a side of the second conductive layer away from the substrate, an orthographic projection of the second conductive layer on the substrate is located within an orthographic projection of the first conductive layer on the substrate, and the orthographic projection of the second conductive layer on the substrate is located within an orthographic projection of the barrier layer on the substrate; and
    a first electrode, electrically connected to the second auxiliary electrode, the first electrode comprising a first conductive portion and a second conductive portion that are connected to each other, the first conductive portion disposed on the first conductive layer and extending along a surface of the first conductive layer away from the substrate, the second conductive portion contacting a side surface of the second conductive layer and extending vertically along the side surface of the second conductive layer, wherein the first electrode is a cathode of the pixel;
    wherein the second auxiliary electrode further comprises an organic layer disposed between the second conductive layer and the barrier layer, wherein an orthographic projection of the organic layer on the substrate is located within the orthographic projection of the first conductive layer on the substrate, and the orthographic projection of the organic layer on the substrate is located within the orthographic projection of the barrier layer on the substrate;
    wherein the second conductive portion extends along the side surface of the second conductive layer, exceeds a height of an upper surface of the second conductive layer, and extends to a side surface of the organic layer.

2. The display substrate according to claim 1, wherein a sum of a thickness of the second conductive layer and a thickness of the organic layer is greater than 1 μm;
    the thickness of the organic layer ranges from 1 μm to 2 μm; and
    a distance between an edge of the orthographic projection of the barrier layer on the substrate and an edge of the orthographic projection of the organic layer on the substrate ranges from 0.5 μm to 0.6 μm.

3. The display substrate according to claim 1, further comprising: an insulating layer disposed on the side of the first auxiliary electrode away from the substrate; wherein the second auxiliary electrode is disposed on a side of the insulating layer away from the substrate, and is electrically connected to the first auxiliary electrode through a first via hole passing through the insulating layer.

4. The display substrate according to claim 3, further comprising a thin film transistor disposed between the substrate and the insulating layer.

5. The display substrate according to claim 4, further comprising:
a second electrode disposed on the side of the insulating layer away from the substrate and electrically connected to the thin film transistor through a second via hole passing through the insulating layer, wherein the second electrode is an anode of the pixel.

6. The display substrate according to claim 5, wherein the second electrode comprises:
a fourth conductive layer, disposed on the side of the insulating layer away from the substrate;
a fifth conductive layer, disposed on a side of the fourth conductive layer away from the substrate; and
a sixth conductive layer disposed on a side of the fifth conductive layer away from the substrate, wherein an orthographic projection of the fifth conductive layer on the substrate is located within an orthographic projection of the fourth conductive layer on the substrate, and the orthographic projection of the fifth conductive layer on the substrate is located within an orthographic projection of the sixth conductive layer on the substrate.

7. The display substrate according to claim 6, wherein the fourth conductive layer and the first conductive layer are disposed on a same layer;
the fifth conductive layer and the second conductive layer are disposed on a same layer; and
the barrier layer and the sixth conductive layer are disposed on a same layer.

8. The display substrate according to claim 7, wherein material for the second conductive layer is aluminum neodymium alloy or molybdenum, and a thickness of the second conductive layer ranges from 3000 angstroms to 6000 angstroms; and
material for the sixth conductive layer is indium tin oxide, and a thickness of the sixth conductive layer ranges from 120 angstroms to 700 angstroms.

9. The display substrate of claim 6, further comprising:
a pixel definition layer, disposed on the first conductive layer and on the fourth conductive layer, wherein the pixel definition layer comprises a first opening and a second opening, the first opening is configured to expose the second auxiliary electrode, and the second opening is configured to expose the second electrode; and
an organic light emitting material layer, comprising a first organic light emitting portion, a second organic light emitting portion, and a third light emitting portion, wherein the first organic light emitting portion is disposed in a region of the first opening adjacent to the pixel definition layer, the second organic light emitting portion is disposed in the second opening and on the second electrode, and the third organic light emitting portion is disposed on a side of the pixel definition layer away from the substrate.

10. The display substrate according to claim 9, wherein the first electrode further comprises a third conductive portion, which is disposed on a side of the third organic light emitting portion away from the substrate and electrically connected to the third conductive portion.

11. The display substrate according to claim 1, wherein the first electrode is made of one of indium zinc oxide and magnesium silver alloy.

12. A method of manufacturing a display substrate, the display substrate comprising a pixel, wherein the method comprising:
forming a first auxiliary electrode on a substrate;
forming a second auxiliary electrode on the first auxiliary electrode, the second auxiliary electrode comprising a first conductive layer, a second conductive layer, and a barrier layer, and electrically connected to the first auxiliary electrode, wherein the first conductive layer is located on a side of the first auxiliary electrode away from the substrate, the second conductive layer is located on a side of the first conductive layer away from the substrate, the barrier layer is located on a side of the second conductive layer away from the substrate, an orthographic projection of the second conductive layer on the substrate is located within an orthographic projection of the first conductive layer on the substrate, and the orthographic projection of the second conductive layer is located within an orthographic projection of the barrier layer on the substrate; and
forming a first electrode, wherein the first electrode is electrically connected to the second auxiliary electrode and comprises a first conductive portion and a second conductive portion that are connected to each other, the first conductive portion is located on the first conductive layer and extends along a surface of the first conductive layer away from the substrate, and the second conductive layer contacts a side surface of the second conductive layer and extends along the side surface of the second conductive layer, wherein the first electrode is a cathode of the pixel;
wherein forming the second auxiliary electrode further comprises: forming an organic layer on the second conductive layer after forming the second conductive layer and before forming the barrier layer, wherein an orthographic projection of the organic layer on the substrate is located within the orthographic projection of the first conductive layer on the substrate, and the orthographic projection of the organic layer on the substrate is located within the orthographic projection of the barrier layer on the substrate;
wherein the second conductive portion extends along the side surface of the second conductive layer, exceeds a height of an upper surface of the second conductive layer, and extends to a side surface of the organic layer.

13. The method according to claim 12, wherein the method further comprises forming the barrier layer on the organic layer.

14. The method according to claim 12, wherein, before forming the second auxiliary electrode, the method further comprises:
forming a thin film transistor on the substrate; and
forming an insulating layer on the substrate, the insulating layer covering the first auxiliary electrode and the thin film transistor;
wherein, forming the second auxiliary electrode further comprises:
forming the second auxiliary electrode on a side of the insulating layer away from the substrate, wherein the second auxiliary electrode is electrically connected to the first auxiliary electrode through a first via hole passing through the insulating layer.

15. The method according to claim 14, wherein after forming the insulating layer, the method further comprises:
forming a second electrode on the side of the insulating layer away from the substrate, wherein the second electrode is electrically connected to the thin film transistor through a second via hole passing through the insulating layer, and the second electrode is an anode of the pixel; and wherein, the second electrode comprises a fourth conductive layer, a fifth conductive layer, and a sixth conductive layer, the fourth conductive layer is located on the side of the insulating layer away from the substrate; the fifth conductive layer is located on a side of the fourth conductive layer away from the substrate, the sixth conductive layer is located on a side of the fifth conductive layer away from the substrate, an orthographic projection of the fifth conductive layer on the substrate is located within an orthographic projection of the fourth conductive layer on the substrate, and the orthographic projection of the fifth conductive layer on the substrate is located within an orthographic projection of the sixth conductive layer on the substrate.

16. The method according to claim 15, wherein the method comprises at least one of following:
   forming the fourth conductive layer and the first conductive layer in a single patterning process;
   forming the fifth conductive layer and the second conductive layer in a single patterning process; and
   forming the barrier layer and the sixth conductive layer in a single patterning process.

17. The method according to claim 14, wherein the first auxiliary electrode and a metal layer of the thin film transistor are formed in a single patterning process.

18. A display device, comprising a display substrate, the display substrate comprising a pixel, wherein the display substrate further comprises:
   a substrate;
   a first auxiliary electrode, disposed on the substrate;
   a second auxiliary electrode, disposed on the first auxiliary electrode and electrically connected to the first auxiliary electrode, the second auxiliary electrode comprising a first conductive layer, a second conductive layer, and a barrier layer, wherein the first conductive layer is disposed on a side of the first auxiliary electrode away from the substrate, the second conductive layer is disposed on a side of the first conductive layer away from the substrate, and the barrier layer is disposed on a side of the second conductive layer away from the substrate, an orthographic projection of the second conductive layer on the substrate is located within an orthographic projection of the first conductive layer on the substrate, and the orthographic projection of the second conductive layer on the substrate is located within an orthographic projection of the barrier layer on the substrate; and
   a first electrode, electrically connected to the second auxiliary electrode, the first electrode comprising a first conductive portion and a second conductive portion that are connected to each other, the first conductive portion disposed on the first conductive layer and extending along a surface of the first conductive layer away from the substrate, the second conductive portion contacting a side surface of the second conductive layer and extending vertically along the side surface of the second conductive layer, wherein the first electrode is a cathode of the pixel;

wherein the second auxiliary electrode further comprises an organic layer disposed between the second conductive layer and the barrier layer, wherein an orthographic projection of the organic layer on the substrate is located within the orthographic projection of the first conductive layer on the substrate, and the orthographic projection of the organic layer on the substrate is located within the orthographic projection of the barrier layer on the substrate;

wherein the second conductive portion extends along the side surface of the second conductive layer, exceeds a height of an upper surface of the second conductive layer, and extends to a side surface of the organic layer.

* * * * *